US006377194B1

(12) United States Patent
Sarpeshkar

(10) Patent No.: US 6,377,194 B1
(45) Date of Patent: Apr. 23, 2002

(54) ANALOG COMPUTATION DEVICE USING SEPARATED ANALOG SIGNALS, EACH HAVING A SPECIFIED AMOUNT OF RESOLUTION, AND SIGNAL RESTORATION DEVICES

(75) Inventor: Rahul Sarpeshkar, Cambridge, MA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/408,137

(22) Filed: Sep. 29, 1999

Related U.S. Application Data

(60) Provisional application No. 60/102,361, filed on Sep. 29, 1998.

(51) Int. Cl.[7] .................................................. H03M 1/18

(52) U.S. Cl. ........................ 341/110; 341/116; 341/158; 341/143; 341/162; 341/59; 341/141

(58) Field of Search ......................... 301/163; 340/347; 341/158, 162, 110, 141, 59, 116, 143

(56) References Cited

U.S. PATENT DOCUMENTS 3,656,152 A * 4/1972 Gundersen .................. 340/347
4,763,107 A * 8/1988 Koen et al. .................. 340/347
5,041,831 A * 8/1991 Bohley et al. .............. 341/144
5,543,795 A * 8/1996 Fernald ....................... 341/163
6,262,678 B1 * 7/2001 Sarpeshkar ................. 341/155

* cited by examiner

*Primary Examiner*—Michael Tokar
*Assistant Examiner*—Lam T Mai
(74) *Attorney, Agent, or Firm*—Fish & Richardson P.C.

(57) ABSTRACT

An analog computation system which forms a hybrid between analog and digital computation. The analog signal is divided into a plurality of separated analog signals, each of the different analog signals collectively representing the original analog signal, and each having less resolution then the total desired resolution. A number of different analog computation elements carry out a mathematical function on the separated signal. Different stages may be provided, and a signal restoration device may be provided between the different stages.

22 Claims, 4 Drawing Sheets

Spike-Based Hybrid Computation $$Q_{State} = (\sum_i I^i_{in}) \times t_{in} \; ; Q_{State} \leq Q_T$$

$$Q_{State} = 0 \; ; Q_{State} > Q_T$$

ANALOG COMPUTATION DEVICE USING SEPARATED ANALOG SIGNALS, EACH HAVING A SPECIFIED AMOUNT OF RESOLUTION, AND SIGNAL RESTORATION DEVICES

CROSS REFERENCE TO RELATED APPLICATIONS

This application claims the benefit of the U.S. Provisional Application No. 60/102,361, filed on Sep. 29, 1998.

The present application describes a hybrid distributed analog computational scheme, which carries out computations in distributed analog computational blocks and performs digital signal restoration of the analog signal at specified intervals between the analog computational stages.

BACKGROUND

Computation is often carried out by encoding information in physical state variables. The information contained in those variables is then processed using physical computation devices.

Analog variables are continuously variable between a lower limit and an upper limit. Digital variables, on the other hand, have only two values and those values matter only at certain times. In synchronous systems, those times coincide with some part of a clock pulse.

Digital systems have been extensively used for computation. Digital systems often show superior noise immunity as compared with analog systems. However, a digital signal is processed using Boolean algebra. This allows logical relationships such as AND, OR, NOT, NAND and XOR in which the transistor is simply used as a switch. Hence, a single transistor carries out a relatively small amount of computation when this scheme is used.

Analog systems can use the inherent properties of the underlying physical technology in which they are implemented. For example, primitives like Kirchoff's voltage and current laws can be used to add two analog signals. Multiplication can be done using the multiplicative relationship between charge (Q), current (I) and time (t), i.e. $Q=I\cdot t$. Such schemes allow much more computation to be done with a single element, e.g., a single transistor.

On the other hand, noise and offset can become a problem in analog systems. The noise in analog systems is typically additive. A cascade of analog stages will inevitably accumulate noise if a sufficiently large amount of analog processing is performed.

As an example of the above, addition of two real numbers with 8-bit resolution can be done with one wire in an analog circuit, using Kirchoff's current. 16 bit addition would be almost $(2^8)^2$ times harder to implement in terms of power or area for the same analog circuit—the resources required by analog computations scale exponentially with the precision of the computation. The same 8-bit addition operation would typically take 224 transistors in a CMOS parallel digital adder circuit. However, 16-bit digital addition would only consume twice as much power, area or time an 8-bit digital addition—the resources needed for digital computations scale as a linear or polynomial function of the precision of the computation.

SUMMARY

The present application combines the advantageous parts of these two technologies by defining a hybrid scheme which uses the advantageous parts of both systems. The hybrid method uses a distributed analog system to compute, along with a discrete digital signal-restoration system to restore and preserve the information in analog signals. Like digital systems, this system uses different circuit portions to calculate different portions of the solution to a problem. Hence, the hybrid system uses the same kind of "divide-and-conquer" approach that is currently used by digital technology to achieve solutions that scale as a linear or polynomial function of the precision required by the computation. However, the computation is done with analog real-valued primitives, not with logical digital primitives, thus more efficiently exploiting the computational primitives inherent in the technology.

The present system uses a plurality of analog processors, each of which has less resolution than is necessary for the precision of the final answer. For example, an 8-bit precise computation requiring $2^8=256$ resolvable levels would be calculated by two analog processors which have 4 bits of analog resolution each, or 4 processors with 2 bits of analog resolution each. The analog processors each compute only a portion of the total solution. They are associated with one another and interact with one another. Since the analog processors operate at relatively low precision, their power consumption and area consumption is low.

The analog processors are combined with elements that achieve noise reduction via signal restoration.

The signal restoration is performed by an analog-to-digital-to-analog converter that restores the analog signal to one of M discrete attractor levels. The input signal is compared with various threshold levels and restored to an attractor state that is closest to the input value.

BRIEF DESCRIPTION OF THE DRAWINGS

These and other aspects will be described in detail with reference to the accompanying drawings, wherein.

DESCRIPTION OF THE PREFERRED EMBODIMENT

Figure 1A:
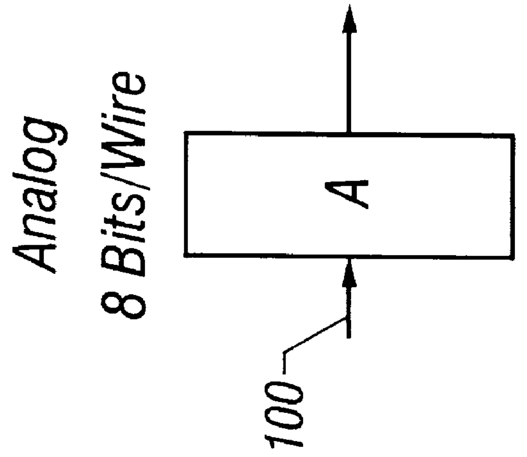
FIG. 1A–1C respectively show a pure analog system, a distributed analog/digital system, and a digital system.

The present application describes a hybrid architecture that combines discrete signal restoration with continuous signal, continuous time, analog computation carried out over distributed computing devices. The usual analog paradigm is shown in FIG. 1A for an 8-bit precise computation. In FIG. 1A, a pure analog signal would put all 8 bits of necessary information on a single wire implying that the noise and offset in the analog signal is sufficiently low such that 256 resolvable analog levels may be defined. One 8-bit precise analog processor would operate on this information.

Figure 1B:
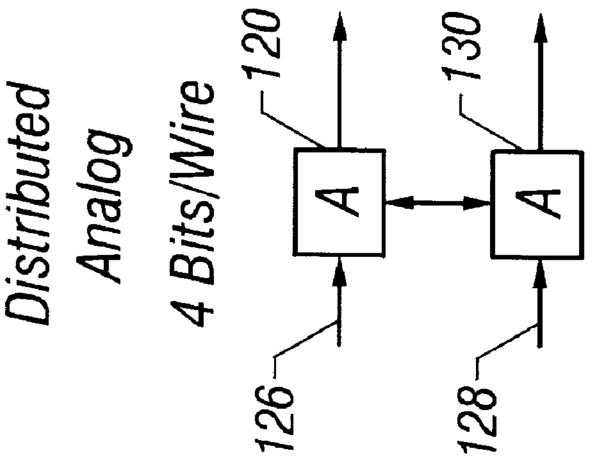
Figure 1C:
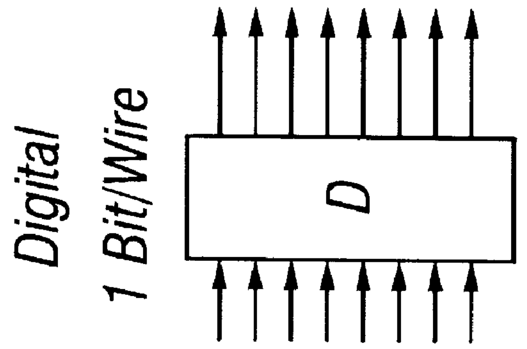

Digital computation, shown in FIG. 1C, uses 8 separate wires, each of which carries one bit of information to represent the same 8-bits of information. This information is acted on by 8 interacting 1-bit precise digital logic units.

In the distributed analog paradigm of the present system, shown in FIG. 1B, the 8 bits of analog information are broken up into multiple different wires 126 and 128. For instance, if two wires are used, each of the two wires feeds an analog processor that maintains 4 bits of precision. The two 4-bit precise analog processors interact with one another. For example, in the system of FIG. 1B, the 8 bits of information may be encoded onto two different processors such that the upper processor, 120, monitors the four most significant bits of analog information, and the lower processor, 130, monitors the four least significant bits of analog information.

An analog encoder, described herein, separates the original analog signal on one wire using an A/D converter or other encoding operation and forms a signal on multiple wires, each having different bits of information. In the present application, the separation of information is into the four most significant bits (MSB) and four least significant bits (LSB). The 4 MSB bits are converted via a D/A operation into one analog value 126, and the 4 LSB bits are converted into the other analog value 128.

Figure 2:
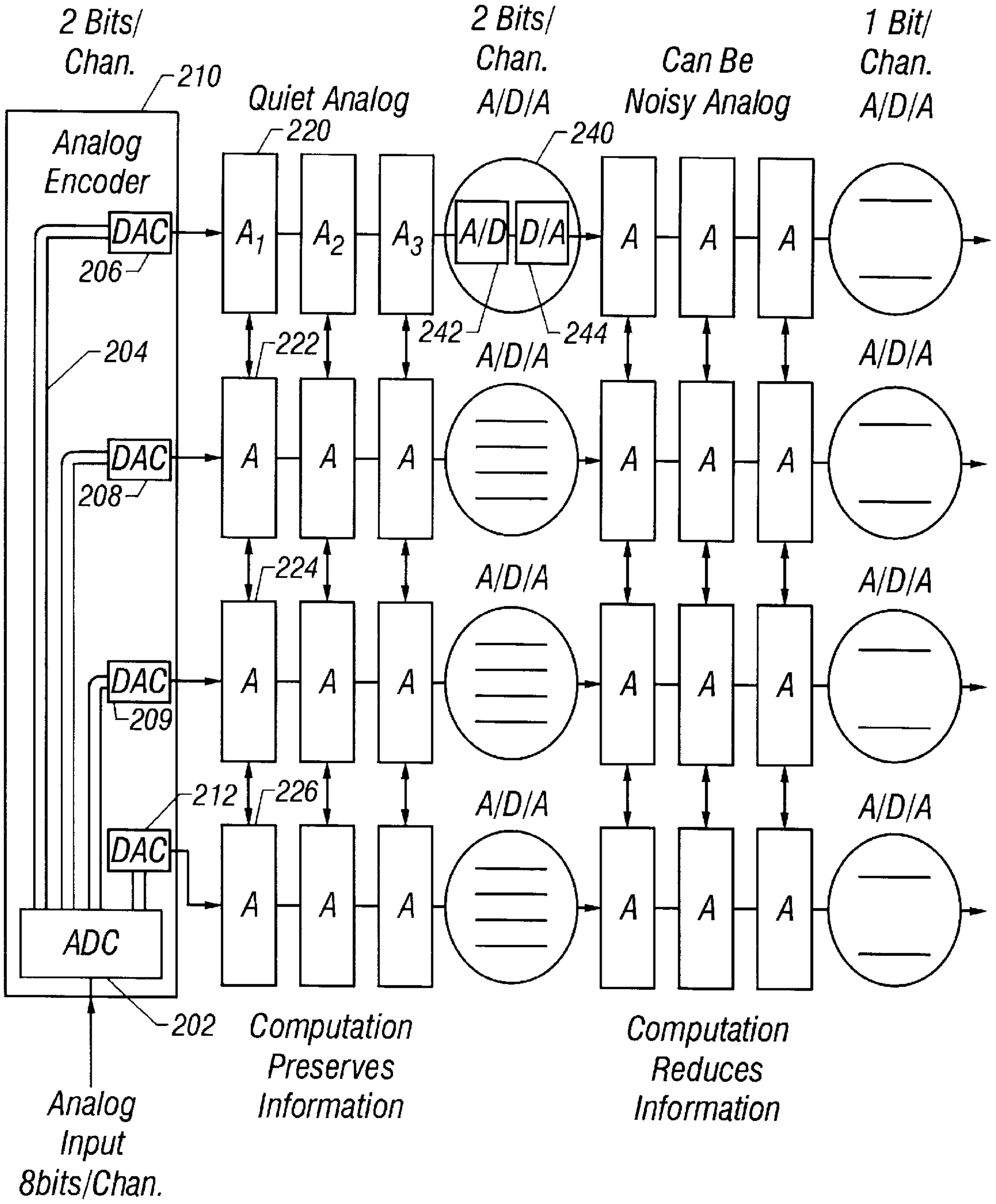
FIG. 2 shows a block diagram of an embodiment of a hybrid distributed analog system.

FIG. 2 shows an exemplary embodiment for the 8-bit example. The original signal is an analog input signal 200. That analog signal 200 is A-to-D converted by ADC 202, and its bits are separated by switching arrangement 204. The bits are then D/A converted by ADCs 206, 208, 209 and 212. The overall analog encoding operation is represented by 210. The four different sets of bits are sent to four different 2-bit precise analog processors. Note that, while the precision of the A/D converter 202 is 8 bits, once the bits have been distributed, all subsequent analog operations can be done at 2 bits of analog resolution.

The analog processors must interact with one another to preserve certain characteristics, such as carry propagation. FIG. 2 shows each of the analog processors 220, 222, 224 and 226 interacting with each other.

Analog systems have been limited by the noise which accumulates in a cascade of analog processing stages. Noise is exhaustively described herein. The present application uses level reconstructors between analog stages, to compensate for noise accumulation in an analog system. In a 2 bit system, as shown in FIG. 2, there are 4 levels. Noise causes the signal to drift above or below those levels. The level reconstructor brings the level precisely back to the optimal level. The level reconstructor brings the level back to the proper level only so long as the noise has not already changed the level so much that it cannot be recognized.

FIG. 2 shows a reconstructor being placed after 3 analog processors, for example.

The reconstructor can be an A/D/A. One form of an A/D/A is an A-to-D converter 242 that is immediately followed by a D to A converter 244. The D/A converter restores the level to the closest one of the quantized levels corresponding to the selected digital level.

A hybrid link is defined as a set of analog processing stages $A_I$ which can be seen FIG. 2 as A1, A2, A3, followed by a level reconstructor 240 that restores the analog signal to one of its M discrete attractor states. Each stage can maintain analog information to a precision of $N=\text{Log}_2 M$ bits, with a relatively low probability of error if the noise is sufficiently less than the distance between attractor states. For example, an error of $10^{-12}$ can be maintained if the noise is less than one-sixteenth the distance between attractor states.

Restoration of a signal requires discrete attractor states. In digital signal restoration, the input signal is compared with a threshold, and the output is restored to a discrete state that is a function of the input discrete state. The input may deviate by a fairly large amount from its attractor state, and the output will still be very close to its attractor state.

The noise immunity of digital circuits arises because the typical distance in voltage space between an input attractor-state level and a threshold level is many times the variance of the noise or the offset in the circuit. Two-state restoration can be generalized to an M-state restoration by having M−1 input threshold levels and M output state levels. The input signal is compared with M−1 threshold levels and is rounded off to that closest attractor state level. Systems like these have been proposed for multistate logic systems.

Figure 3:
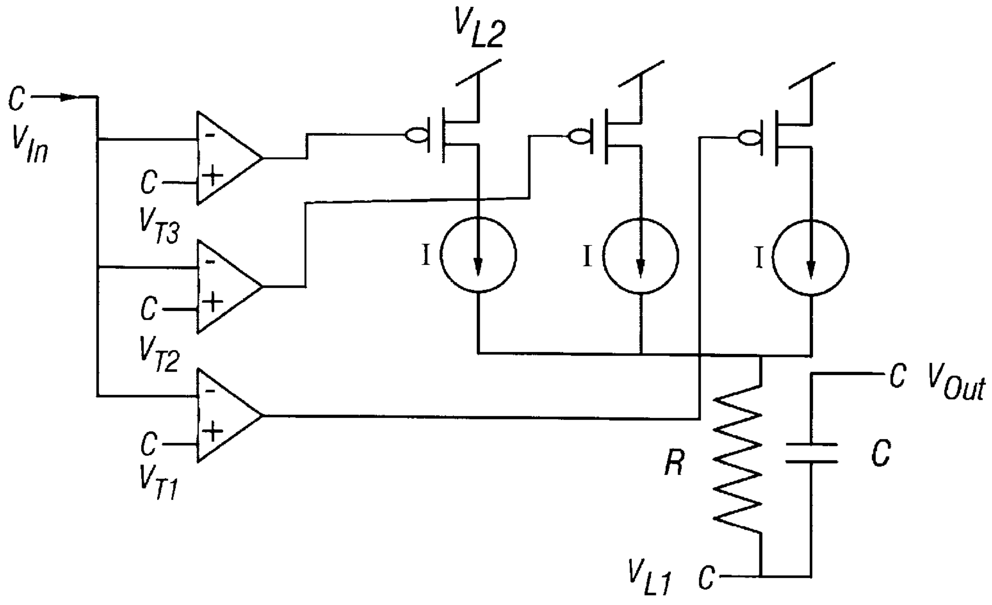
FIG. 3 shows a signal restoration device.

FIG. 3 shows the threshold levels $V_{Ti}$ and restoration levels $V_{Li}$ for a four-state or 2-bit system. The arrows converge on restoration levels and diverge from threshold levels.

The A/D/A modifies the digital restoration scheme for M states to an analog restoration scheme for M states. In the analog restoration scheme, M can be arbitrary and does not have to be 1, 2, 4, 8, 16, 32, and so on. It can be any arbitrary number that is selected. Unlike multistate logic, no digital computation is done with inputs or outputs.

It is important to note that the present system is not a multilevel logic scheme. The present system allows computing on the set of reals with real-numbered primitives, which are resolution independent. The level reconstruction effectively rounds off to the set of integers. In contrast, multilevel logic schemes compute on the set of integers with integer primitives that are resolution dependent (the number of levels and the radix change the logical rules completely). The present system uses primitives of computation which are resolution independent, e.g., the law of adding 2 real numbers is the same independent of precision. However, the precision to which we may round a continuous number to its nearest discrete approximant is resolution dependent.

The input $V_{in}$ is an analog signal that may have been processed by many analog stages. The output $V_{out}$ is a restored and filtered analog signal that can serve as an input to future analog-processing stages.

FIG. 3 shows a circuit for one possible implementation of a four-state A/D/A. The analog signal is compared with three thresholds, and zero, one, two, or three currents are switched onto a resistor, whose voltage then equilibrates at $V_{L1}$, $V_{L1}$+1R, or $V_{L1}$+2IR, or $V_{L1}$+3IR respectively. The RC circuit acts as a filter and removes sharp edges in the signal. The capacitance is chosen such 1/(RC) is at or near the desired bandwidth of the input. If an input analog signal happens to be exactly at a threshold level $V_{Ti}$, then it will be restored at random to the attractor state above or below it. However, since the signal is always within half a bit of the analog input, this random restoration still preserves the input information to within 1 bit, as desired. All other analog inputs are restored to within a half-bit of their input values as well. Thus, information in the analog signal is preserved to a precision of $\log_2 M$ bits.

A specific embodiment of the present system uses a general scheme for hybrid distributed analog computation with spike-based techniques. Such techniques use spikes (pulses) extensively.

Figure 4:
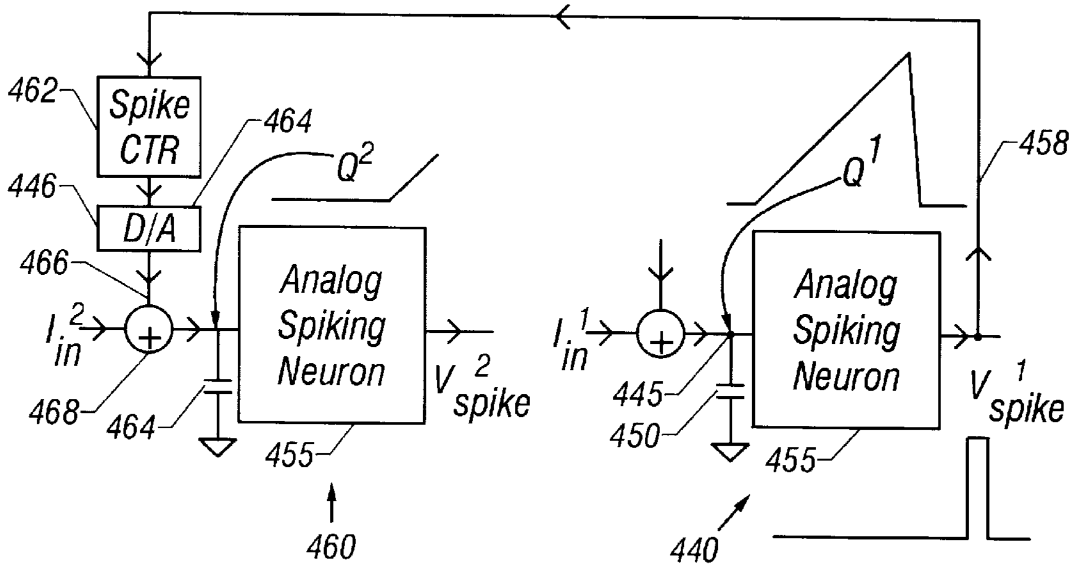
FIG. 4 shows a real system.

FIG. 4 shows how an analog state variable can be represented by the amount of charge on a capacitor 450. That charge is referred to as $Q_{state}$. Each analog state can be changed by charging the capacitor or by discharging it with input currents for a time period $T_N$. By knowing that $$i = \frac{dQ_{state}}{dt} = c\frac{dV_{state}}{dt}$$

the amount of voltage change on the capacitor can be calculated.

The simple circuit shown herein already has primitives for an add operation using Kirchoff's current law: currents may be added at node 445 in FIG. 4. A multiply can be carried out via use of the relationship $Q_{state}=I \cdot T_N$. The currents may themselves be linear or nonlinear functions of other currents or voltages. Hence, this system provides the ability to implement a gated summation of various nonlinear input terms.

Limits must be set on the Q value to keep the variable from reaching the upper limit of its dynamic range. When the charge value $Q_{state}$ is less than some threshold $Q_t$, charging is allowed; when $Q_t$ is reached, $Q_{state}$ is reset to zero, and the neighboring channel 460 is signaled on spike line 458 to indicate that an overflow has occurred. Charging is resumed in channel 440 after the spike is used to indicate the overflow.

The neighboring channel can be a similar charge-and-reset unit on a neighboring capacitor 464. The spike causes the neighboring channel to increment the charge on capacitor 464 by a discrete amount that is a fraction of $Q_t$, but which represents the value of overflow from channel 440.

The input currents charge a capacitor 450. The capacitor reaches a certain threshold voltage and fires a spike via a neuron circuit 455. The spike increments the spike counter 462. The output of spike counter 462 is D-to-A converted by weighted DAC 464. The output of 464 is added to other input currents at node 468. The D-to-A converter outputs a specific amount of charge 466 corresponding to the spike.

Figure 5:
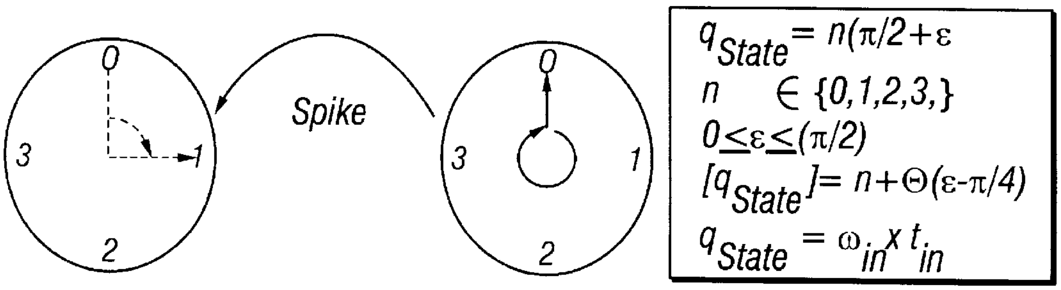
FIG. 5 shows one way that the system can keep track of the variables.

FIG. 5 illustrates that the operations that have been described previously may be represented in an angular coordinate system. Charge is represented by an angular state variable $0 \leqq Q \leqq 2\pi$. $Q_{state}=Q_T$ corresponds to $\Theta=0$ and $Q_{state}=Q_t$ corresponds to $\Theta=2\pi$. When $\Theta=2\pi$ the system wraps around by resetting to zero, fires a spike, and signals to a similar adjacent angular state variable that one full revolution has occurred on a neighboring channel. The adjacent channel keeps track of the full revolutions performed by incrementing its change by a fraction of $Q_T$ for each full revolution of the neighboring channel.

Signal restoration of angular information corresponds to quantizing the channel angle by rounding it up or down to the nearest allowable discrete angle. For example, if two bits of information are represented per channel, the channel only needs rounding to the nearest quadrant. Thus, the state variable is rounded to whichever angle in the set, from the group consisting of 0, π/2, π, 3π/2 and 2π is closest. If the closest value is 2π, a spike is fired and the variable is reset to zero. This is shown in mathematical form as follows $$Q_{state} = \left(\sum_i I_{in}^i\right) x t_{in};\ Q_{state} \le Q_T$$

$$Q_{state} = O \qquad ;\ Q_{state} > Q_T$$

where $q_{state}=n(\pi/2)+\epsilon$ $n \in \{0,1,2,3\}$ $0 \leqq \epsilon \leqq (\pi/2)$ $[q_{state}]=n+\Theta(\epsilon-\pi/4)$ $q_{state}=\omega_{in}\chi t_{in}$ FIG. 5 also shows how the two bit representation can be preserved across channels. The neighboring channel can be incremented by π/2 whenever the current channel has finished a full revolution of 2π. This produces a method of approximating an analog number in a number representation based on radix 4.

What is claimed is:

1. An analog computation system, comprising:

at least a plurality of analog computation elements, each having less resolution than is desired for a particular operation, said analog computation elements collectively allowing at least one mathematical function to be carried out; and a signal restoration device, coupled to receive an output of at least one of said analog computation elements, and operating to restore a level of said output to a discrete analog level which is closest to an ideal discrete analog level.

2. A system as in claim 1 wherein said analog computation elements can each operate with sufficient precision such that four signal levels may be resolved per analog computational channel.

3. A system as in claim 1 wherein said analog computation elements can each operate with sufficient precision such that sixteen signal levels may be resolved per analog computational channel.

4. A system as in claim 1 wherein said analog computation elements each have sixteen levels of resolution.

5. A system as in claim 1 wherein said signal restoration is via an A to D converter, followed by a D to A converter.

6. A system as in claim 1 wherein said signal restoration device is an analog circuit that detects a level of a signal, determines which of a plurality of different ideal levels is closest to the detected level, and restores a level of said signal to said detected level.

7. An analog computation system, comprising:

at least a plurality of analog computation elements, each having less resolution than is desired for a particular operation, said analog computation elements collectively allowing at least one mathematical function to be carried out;

a signal restoration device, coupled to receive an output of at least one of said analog computation elements, and operating to restore a level of said output to a discrete analog level which is closest to an ideal discrete analog level; and an analog encoder at a front end, accepting an analog input, and dividing said analog input into a plurality of separated analog inputs, each of said separated analog inputs connected to one of said analog computation elements.

8. A device as in claim 6 wherein said analog encoder comprises an A-to-D converter, producing a plurality of digital outputs, and said digital outputs being wired in groups to a plurality of D to A converters, which produce analog signals indicative of said digital outputs.

9. An analog computation system, comprising:

at least a plurality of analog computation elements, each having less resolution than is desired for a particular operation, said analog computation elements collectively allowing at least one mathematical function to be carried out; and a signal restoration device, coupled to receive an output of at least one of said analog computation elements, and operating to restore a level of said output to a discrete analog level which is closest to an ideal discrete analog level, wherein said analog computation elements are arranged in stages, each stage having a plurality of analog computation elements which communicate with one another, and said communicate of said analog computation outputs comprises a carry.

10. A system as in claim 9 wherein said carry tells an adjacent analog processor in a same stage to increment its value by a preset amount.

11. An analog computation system, comprising:

a node, operating to receive an analog signal;

an analog encoder, dividing said analog signal into a plurality of separated analog signals, said plurality of separated analog signals collectively representing said analog signal;

a plurality of analog processors, forming a first stage of analog processing, each said stage collectively receiving one of said separated analog signals and carrying out some computation on said analog signals;

a plurality of additional analog processors, forming at least one additional stage, coupled to respective outputs of said analog processors in said first stage; and a signal restoration device, located after a preset number of analog processing stages and operating to change an output level of said analog channel to a predetermined quantized output level.

12. A system as in claim 11 wherein said analog encoder accepts an analog input, and divides said analog input into a plurality of separated analog inputs, each of said separated analog inputs connected to one of said analog computation elements of said first stage.

13. A system as in claim 11 wherein said signal restoration device comprises an A to D converter coupled to a D to A converter.

14. A system as in claim 11 wherein said signal restoration device is located after three analog processors in a row.

15. A system as in claim 11 wherein said analog restoration device is located at a location where an amount of noise is less than one sixteenth of the distance between adjacent restoration levels.

16. A system as in claim 14 wherein said analog processors each have four restoration levels.

17. A system as in claim 11 wherein said analog computation elements in adjacent stages communicate with one another.

18. A system as in claim 16 wherein said communication is via a carry signal.

19. A system as in claim 17 wherein an adjacent processor changes its analog value based on said carry signal.

20. A system as in claim 18 wherein said carry is effected added by summing currents at a node.

21. A device as in claim 11 further comprising two inputs connected to a summing node at an input thereof, said two inputs summing via Kirchoff's current law.

22. A method of analog computation, comprising:

obtaining an analog value to be processed;

dividing said analog value into a plurality of separated analog values, each having less resolution than the original analog value;

processing each of the analog values in a plurality of analog processors;

determining a location where a noise is statistically likely; and restoring the analog signal to a desired analog signal at said location.

* * * * *